(12) United States Patent
DeBruyn et al.

(10) Patent No.: US 7,403,573 B2
(45) Date of Patent: Jul. 22, 2008

(54) UNCORRELATED ADAPTIVE PREDISTORTER

(75) Inventors: William P. DeBruyn, Elk Grove Village, IL (US); Edward V. Louis, St. Charles, IL (US); Rajiv Chandrasekaran, Basking Ridge, NJ (US)

(73) Assignee: Andrew Corporation, Westbrook, IL (US)

( * ) Notice: Subject to any disclaimer, the term of this patent is extended or adjusted under 35 U.S.C. 154(b) by 826 days.

(21) Appl. No.: 10/342,633

(22) Filed: Jan. 15, 2003

(65) Prior Publication Data

US 2004/0136470 A1    Jul. 15, 2004

(51) Int. Cl.
    *H04K 1/02* (2006.01)
(52) U.S. Cl. .............. 375/297; 375/296; 455/126; 455/127.1; 330/149
(58) Field of Classification Search ............ 375/278, 375/284, 285, 296–297, 279; 330/75, 149, 330/302, 151, 250, 260, 279, 315, 136, 297; 458/63, 126; 332/107, 123, 159–160; 455/63, 455/114, 70, 69, 126–127
    See application file for complete search history.

(56) References Cited

U.S. PATENT DOCUMENTS

| 3,241,078 | A | 3/1966 | Jones ............... 329/50 |
| 3,689,752 | A | 9/1972 | Gilbert ............ 235/194 |
| 4,156,283 | A | 5/1979 | Gilbert ............ 364/841 |
| 4,870,371 | A | 9/1989 | Gottwald et al. ..... 330/149 |
| 4,879,519 | A | 11/1989 | Myer ............... 330/149 |
| 4,978,873 | A | 12/1990 | Shoemaker .......... 307/498 |
| 5,023,565 | A | 6/1991 | Lieu ............... 330/151 |
| 5,049,832 | A | 9/1991 | Cavers ............. 330/149 |
| 5,115,409 | A | 5/1992 | Stepp .............. 364/841 |
| 5,119,040 | A | 6/1992 | Long et al. ........ 330/140 |
| 5,130,663 | A | 7/1992 | Tattersall, Jr. .... 330/52 |
| 5,323,119 | A | 6/1994 | Powell et al. ...... 330/151 |
| 5,325,095 | A | 6/1994 | Vadnais et al. ..... 342/22 |

(Continued)

FOREIGN PATENT DOCUMENTS

EP    0 085 600 A1    1/1983

(Continued)

OTHER PUBLICATIONS

Lohita et. al., "Power Amplifier Linearization using Cubic Spline Interpolation" IEEE 1993.*

(Continued)

*Primary Examiner*—Mohammad H. Ghayour
*Assistant Examiner*—Sophia Vlahos
(74) *Attorney, Agent, or Firm*—Wood, Herron & Evans, LLP

(57) ABSTRACT

An uncorrelated adaptive predistorer configured for use with an RF power amplifier having an input loop configured to be coupled to the input of the RF power amplifier an output loop coupled to the output of the RF power amplifier. Such an input loop includes a look-up table containing predistortion values to be apply to an input signal, in response to a monotonically increasing function of the input signal power, for forming a predistorted input signal. Such an output loop configured to measure an intermodulation distortion product of the RF power amplifier output resulting from the predistorted input signal, and operable to update the predistortion values in the look-up table.

30 Claims, 3 Drawing Sheets

U.S. PATENT DOCUMENTS

| | | | |
|---|---|---|---|
| 5,414,383 A | 5/1995 | Cusdin et al. | 329/304 |
| 5,477,187 A | 12/1995 | Kobayashi et al. | 330/52 |
| 5,485,120 A | 1/1996 | Anvari | 330/151 |
| 5,491,454 A | 2/1996 | Matz | 330/149 |
| 5,528,196 A | 6/1996 | Baskin et al. | 330/151 |
| 5,594,385 A | 1/1997 | Anvari | 330/149 |
| 5,610,554 A | 3/1997 | Anvari | 330/52 |
| 5,617,061 A | 4/1997 | Fukuchi | 330/151 |
| 5,621,354 A | 4/1997 | Mitzlaff | 330/52 |
| 5,691,668 A | 11/1997 | Yoshikawa et al. | 330/151 |
| 5,699,383 A * | 12/1997 | Ichiyoshi | 375/297 |
| 5,732,333 A | 3/1998 | Cox et al. | 455/126 |
| 5,760,646 A | 6/1998 | Belcher et al. | 330/149 |
| 5,808,512 A | 9/1998 | Bainvoll et al. | 330/151 |
| 5,831,478 A | 11/1998 | Long | 330/52 |
| 5,862,459 A | 1/1999 | Charas | 455/114 |
| 5,867,065 A | 2/1999 | Leyendecker | 330/149 |
| 5,877,653 A | 3/1999 | Kim | 330/149 |
| 5,892,397 A | 4/1999 | Belcher et al. | 330/149 |
| 5,900,778 A | 5/1999 | Stonick et al. | 330/149 |
| 5,912,586 A | 6/1999 | Mitzlaff | 330/149 |
| 5,923,214 A | 7/1999 | Mitzlaff | 330/52 |
| 5,929,703 A | 7/1999 | Sehier et al. | 330/149 |
| 5,933,766 A | 8/1999 | Dent | 455/103 |
| 5,959,499 A | 9/1999 | Khan et al. | 330/149 |
| 5,963,090 A * | 10/1999 | Fukuchi | 330/149 |
| 5,986,499 A | 11/1999 | Myer | 330/52 |
| 6,046,635 A | 4/2000 | Gentzler | 330/149 |
| 6,052,023 A | 4/2000 | Myer | 330/2 |
| 6,072,364 A * | 6/2000 | Jeckeln et al. | 330/149 |
| 6,075,411 A | 6/2000 | Briffa et al. | 330/149 |
| 6,078,216 A * | 6/2000 | Proctor, Jr. | 330/151 |
| 6,091,715 A | 7/2000 | Vucetic et al. | 370/277 |
| 6,101,225 A * | 8/2000 | Thorson | 375/308 |
| 6,104,239 A | 8/2000 | Jenkins | 330/2 |
| 6,118,335 A | 9/2000 | Nielsen et al. | 330/2 |
| 6,118,339 A | 9/2000 | Gentzler et al. | 330/149 |
| 6,125,266 A * | 9/2000 | Matero et al. | 455/126 |
| 6,137,335 A | 10/2000 | Proebsting | 327/281 |
| 6,141,390 A | 10/2000 | Cova | 375/297 |
| 6,144,255 A | 11/2000 | Patel et al. | 330/151 |
| 6,148,185 A | 11/2000 | Maruyama et al. | 455/115 |
| 6,154,641 A | 11/2000 | Zhang | 455/112 |
| 6,157,253 A | 12/2000 | Sigmon et al. | 330/10 |
| 6,208,846 B1 | 3/2001 | Chen et al. | 455/127 |
| 6,236,267 B1 | 5/2001 | Anzil | 330/149 |
| 6,236,837 B1 | 5/2001 | Midya | 455/63 |
| 6,275,685 B1 * | 8/2001 | Wessel et al. | 455/126 |
| 6,285,251 B1 | 9/2001 | Dent et al. | 330/127 |
| 6,285,255 B1 | 9/2001 | Luu et al. | 330/149 |
| 6,304,140 B1 | 10/2001 | Thron et al. | 330/149 |
| 6,342,810 B1 | 1/2002 | Wright et al. | 330/51 |
| 6,356,146 B1 | 3/2002 | Wright et al. | 330/2 |
| 6,359,508 B1 | 3/2002 | Mucenieks | 330/149 |
| 6,377,785 B1 | 4/2002 | Ogino | 455/127 |
| 6,388,518 B1 | 5/2002 | Miyatani | |
| 6,600,792 B2 * | 7/2003 | Antonio et al. | 375/297 |
| 6,714,073 B2 * | 3/2004 | Suto et al. | 330/149 |
| 2002/0101937 A1 | 8/2002 | Antonio et al. | |
| 2004/0001559 A1 * | 1/2004 | Pinckley et al. | 375/297 |

FOREIGN PATENT DOCUMENTS

| | | |
|---|---|---|
| EP | 0 367 457 B1 | 3/1996 |
| EP | 0 998 026 A1 | 5/2000 |
| EP | 0 948 131 B1 | 3/2002 |
| GB | 2 347 031 A | 2/1999 |
| GB | 2 369 735 | 6/2002 |
| GB | 2 376 584 | 12/2002 |
| WO | WO 97/08822 | 3/1997 |

OTHER PUBLICATIONS

Lohtia, Anit et al., "Power Amplifier Linearization using Cubic Spline Interpolation", *IEEE*, (1993), No. 0-7803-1266-x/93, pp. 676-679.

Stapleton, Shawn P., "Amplifier Linearization Using Adaptive Digital Predistortion—The need for greater linearity can be addressed at the digital coding level", *Applied Microwave & Wireless*, Technical Feature, (Feb. 2001), pp. 72-77.

* cited by examiner

US 7,403,573 B2

UNCORRELATED ADAPTIVE PREDISTORTER

FIELD OF THE INVENTION

This invention relates generally to amplifiers, and more particularly to distortion reduction techniques in such amplifiers.

BACKGROUND OF THE INVENTION

Wireless communications services within a cellular network are provided through individual geographic areas or "cells." Historically, a cell site has generally included a cellular tower, having RF antennas that communicate with a plurality of remote devices, such as cellular phones and paging devices, and a base terminal station (BTS). A BTS typically includes one or more radio frequency (RF) power amplifiers coupled to the RF antennas for transmitting wireless communication signals to the remote devices. Cellular networks may provide services using digital modulation schemes. Such modulation schemes may include time division multiple access (TDMA), code division multiple access (CDMA), and Global System for Mobile communications (GSM), as well as others.

In a theoretical or an ideal RF power amplifier, the output power of the amplifier is equal to the input power of the amplifier multiplied by a constant (K), i.e., the amplification or gain factor, and does not vary with input power level. Moreover, the phase of the output signal is the same as the phase of the input signal. Practically, both the output power and phase vary as a function of the input signal.

Generally, an amplifier has three operating regions. The first region, or linear region, includes operation where input signal power levels are relatively small and K remains constant. In the linear region, the response of an amplifier closely approximates that of an ideal amplifier. The second and third regions are referred to as non-linear regions. The second region or compression region begins where input power levels have increased to the point that K begins to reduce or roll-off with further increases in input power. The third region or saturation region is where the output power of the amplifier fails to increase with an increase in input power.

Increased demands on the RF spectrum caused by continued increases in the number of wireless communications users require more spectrally efficient modulation schemes, such as the aforementioned digital modulation schemes, and more efficient amplifiers for use therewith. Moreover, wireless devices used with cellular communications systems require high power efficiency for purposes of extending battery life. Thus, RF power amplifiers used in such systems are often operated close to or in a non-linear region to maximize efficiency.

Unfortunately, operation near a non-linear region may result in non-linear operation when digital modulation schemes having a fluctuating envelope are used. For example, operation in compression may result in distortion and spectral spreading into adjacent channels. The Federal Communications Commission (FCC), like other governing bodies, limits emissions in adjacent channels. Band broadening and/or an increase in the bit error rate may also result. Governing bodies typically limit out of band emissions as well. In some instances, the number of calls a system is capable of supporting may be reduced.

Thus, it is desirable to reduce non-linearities in the response of such amplifiers thereby increasing efficiency. Techniques developed to reduce non-linearities in amplifiers may be categorized as either feed-forward, feedback or predistortion, each having their respective advantages and disadvantages.

The feed-forward technique attenuates a portion of an RF power amplifier output signal so that it is the same level as the input signal. The difference between this distorted output signal and the input signal is used to generate an error signal. The error signal is then amplified and subtracted from the RF power amplifier output, improving the linearity of the RF power amplifier. Generally, feed-forward techniques are capable of handling multi-carrier signals, but are ill equipped in dealing with the effects of drift typically associated with RF power amplifiers.

The feedback technique uses synchronously demodulated output signals as the feedback information, forming a feedback loop. These signals are subtracted from the input signals, generating loop error signals. If the feedback loop gain is sufficient, the loop error signals continuously correct any non-linearity in the RF power amplifier response. Generally, feedback techniques used with RF power amplifiers provide a reduction in out of band emissions, while being easily implemented. However, stability requirements limit bandwidth due to a dependence on loop delay. Thus, feedback techniques are of limited utility when used with certain modulation schemes.

The predistortion technique provides an appropriately distorted signal to the RF power amplifier, so that the RF power amplifier output is a scaled replica of the input signal. One type of predistorter uses a fixed signal predistortion circuit prior to amplification. A fixed type predistorter is of limited utility when used with a digital modulation scheme having a fluctuating envelope, however, and does not account for changes, or drifts, in RF power amplifiers used therewith.

Another type of predistorter is an adaptive predistorter. In one adaptive predistorter the amplitude modulation to amplitude modulation (AM-AM) and the amplitude modulation to phase modulation (AM-PM) characteristics of an RF power amplifier are estimated using a mathematical technique such as cubic spline interpolation, from a look-up table of distortion values generated using synchronous demodulation from the RF power amplifier output. The estimated values are then used to predistort the input signal to the RF power amplifier. The performance of an adaptive predistorter is typically comparable with that of negative feedback and feed-forward techniques without being limited in the modulation scheme used or suffering from drift.

Generally, such an adaptive predistorter operates as follows. First, a digital signal or a baseband signal is encoded into in-phase (I) and quadrature-phase (Q) components. The I/Q components then pass through a pulse-shaping filter to ensure inter-symbol-interference (ISI) free transmission. The I/Q signals are then applied to a squaring circuit that produces a scalar value $(Vm)^2$ indicative of the power of the baseband input signal. The scalar value $(Vm)^2$ is then used as a pointer to a look-up table that contains predistortion values for the I/Q components. The predistortion values are then multiplied with the I/Q components, generating predistorted signals $I_d$ and $Q_d$, respectively. The predistorted signals $I_d$ and $Q_d$ are then converted to analog signals and applied to a quadrature modulator. The quadrature modulator, driven by an oscillator, generates a modulated RF signal that is applied to the RF power amplifier.

A portion of the RF power amplifier output is applied to a quadrature demodulator, driven by the same oscillator, to produce I/Q baseband signals. The I/Q baseband signals are converted into digital signals (I'/Q'). I'/Q' are then compared to I/Q, respectively, to estimate the AM-AM and AM-PM characteristics of the RF power amplifier. Since there is a delay in time between when the predistorted signals $I_d/Q_d$ are applied to the RF power amplifier and the time that digital signals I'/Q' are developed, the input signals I/Q must be delayed by that same amount of time before making the comparison. Thus, such a predistorter, in comparing I/Q signals, may be said to be "correlated" in that there is a one-to-one correspondence between I/Q and I'/Q' and "adaptive" in that the values in the look-up table change with time.

Such correlated adaptive predistorters may use cubic spline interpolation in estimating the AM-AM and AM-PM characteristics for values of $(Vm)^2$, using values stored in the look-up table. Accuracy equivalent to that afforded by cubic spline interpolation requires a high order polynomial for a single polynomial fit. Although the use or application of cubic spline interpolation avoids the need for higher order polynomials in linearizing the response of an RF power amplifier, such correlated adaptive predistorters are still complex and costly by virtue of the delay and demodulation circuits used therein.

BRIEF DESCRIPTION OF THE DRAWINGS

The accompanying drawings, which are incorporated in and constitute a part of this specification, illustrate embodiments of the invention and, together with the detailed description given below, serve to explain the principles of the invention.

DETAILED DESCRIPTION OF THE DRAWINGS

Figure 1:
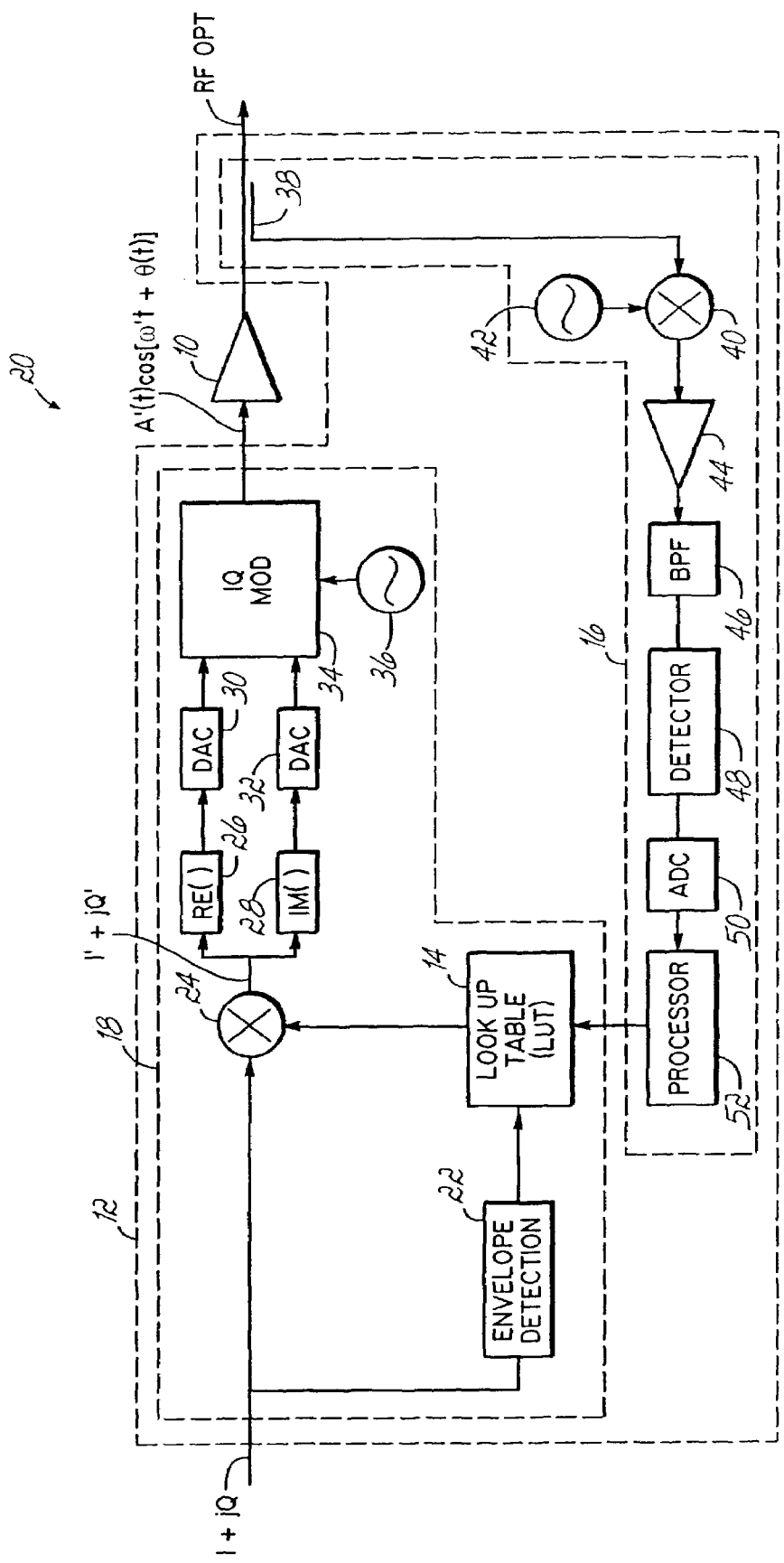
FIG. 1 is a schematic diagram of a first embodiment of an uncorrelated adaptive predistorter in accordance with the principles of the present invention.
Figure 2:
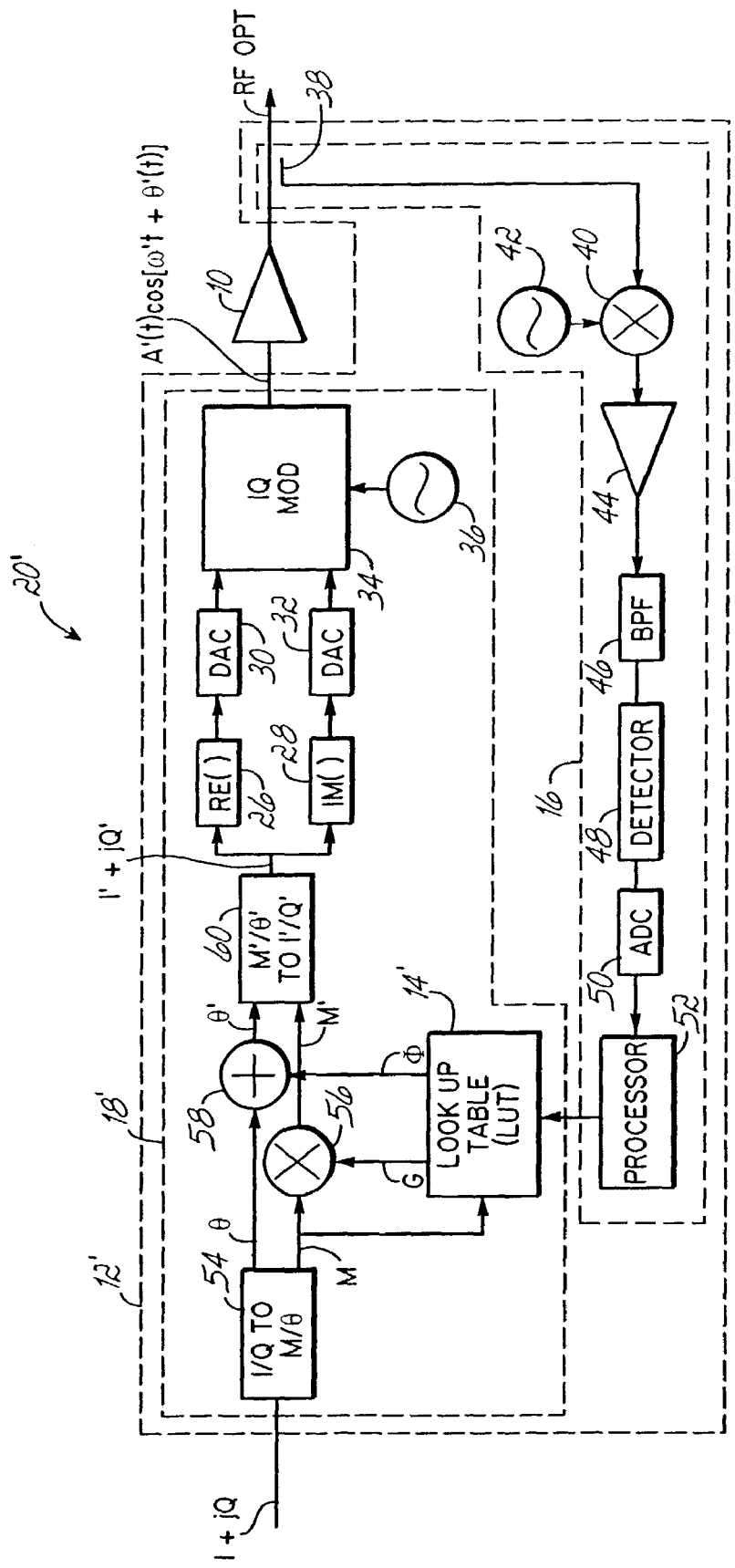
FIG. 2 is a schematic diagram of a second embodiment of an uncorrelated adaptive predistorter in accordance with the principles of the present invention; and, FIG. 3 is a schematic diagram of a third embodiment of an uncorrelated adaptive predistorter in accordance with the principles of the present invention.
Figure 3:
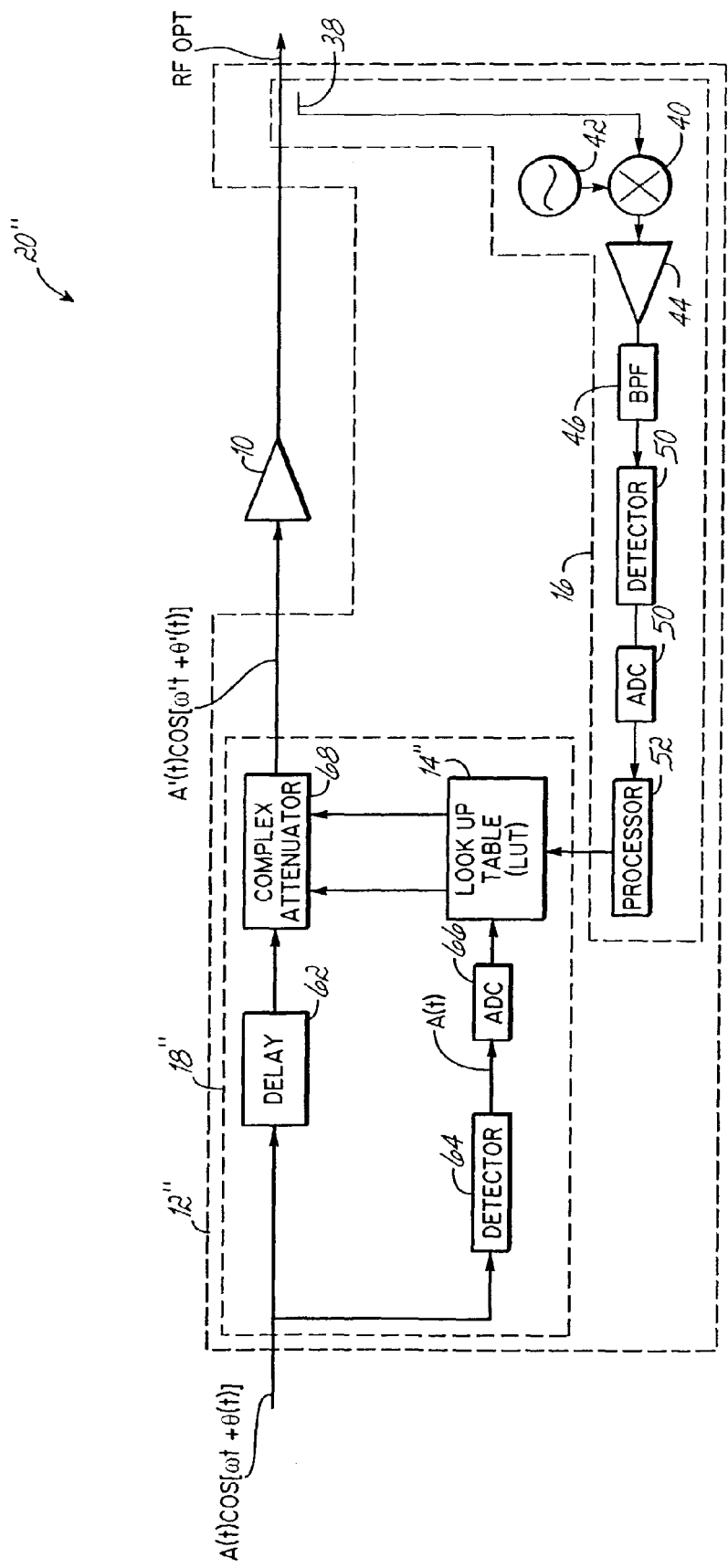

With reference to FIGS. 1-3, wherein like numerals denote like parts, there is shown a radio frequency (RF) power amplifier and an adaptive predistorter for use therewith. The adaptive predistorter is configured to reduce non-linearities in the response of the RF power amplifier, thereby allowing an increase in efficiency, with reduced complexity and cost. More specifically, the adaptive predistorter comprises an input loop including a digitally based look-up table (LUT) containing predistortion values and an output loop that measures an intermodulation (IM) distortion product of the RF power amplifier and updates LUT predistortion values accordingly. Further, a spline function may be used to produce an optimal set of values in the LUT such that the IM distortion product of the RF power amplifier in the output loop is minimized.

Referring first to FIG. 1, a first embodiment 20 of an amplifier system comprises an RF power amplifier 10 and an uncorrelated adaptive predistorter 12. RF power amplifier 10 is typical of RF power amplifiers known to those skilled in the art having linear, compression, and saturation regions of operation. Moreover, RF power amplifier 10 may be a single channel or a multi-channel amplifier or a class AB or class B amplifier.

Uncorrelated adaptive predistorter 12 comprises an input loop 18 and an output loop 16. Input loop 18 comprises envelope detection circuit 22, LUT 14, complex multiplier 24, real and imaginary circuits 26, 28, first and second digital-to-analog converters (DACs) 30, 32, quadrature modulator 34, and RF oscillator 36. Output loop 16 comprises coupler 38, mixer 40, local oscillator 42, amplifier 44, bandpass filter (BPF) 46, detector 48, analog-to-digital converter (ADC) 50, and processor 52.

As configured in FIG. 1 input loop 18 accepts an input signal of the type including in-phase and quadrature-phase components I+jQ, referred to herein as a "baseband signal", coupling the signal I+jQ to envelope detection circuit 22 and complex multiplier 24. Envelope detection circuit 22 produces a scalar value representative of a monotonically increasing function of the input power, e.g., power, logarithm of the input power, square root of the input power, etc., of the signal I+jQ that functions as an index to LUT 14.

LUT 14 contains predistortion values for the in-phase (I) and quadrature-phase (Q) components of signal I+jQ. The initial values in LUT 14 may be determined in one of a number of ways. For example, a calibration routine may be used to determine the transfer characteristics of a particular RF power amplifier, and the initial values in a LUT may be based thereon. Similarly, a particular family or type of RF power amplifiers may be characterized and the initial values in a LUT may be based on such a generalized characterization. Other methods of characterizing the performance of an amplifier and populating a LUT will readily appear to those of skill in the art.

LUT 14 couples the initial predistortion values to complex multiplier 24 where the predistortion values are multiplied with signal I+jQ, forming predistorted signal I'+jQ'. Complex multiplier 24 couples the in-phase (I') and quadrature phase (Q') components of predistorted signal I'+jQ', to real (RE( )) and imaginary (IM( )) circuits, as indicated at reference numerals 26 and 28, respectively. Those skilled in the art will appreciate that the separation of the real and imaginary portions of input signal I+jQ may be traditionally done inside complex mixer 24, however, real (RE( )) and imaginary (IM( )) circuits 26, 28 are included for purposes of further illustration should any additional circuitry be necessary for separation in a particular embodiment.

Real and imaginary circuits 26,28 couple the in-phase (I') and quadrature phase (Q') components of predistorted signal I'+jQ' to first and second DACs 30, 32, respectively. First and second DACs 30, 32 convert the real (I') and imaginary (Q') portions of digital signal I'+jQ' to analog signals, coupling the analog signals to quadrature modulator 34.

Quadrature modulator 34, coupled to RF oscillator 36, modulates the analog I' and Q' signals onto a carrier, and couples the carrier to RF power amplifier 10, as indicated by signal A'(t)cos [ω't+θ'(t)]. RF power amplifier 10 amplifies the signal A'(t)cos [ω't+θ'(t)], and has an output signal as indicated at RF OPT. Such an output signal RF OPT may be coupled to an antenna for purposes of communicating a digital in-phase and quadrature-phase signal I+jQ to a wireless device.

Referring now to output loop 16, a portion of the output signal RF OPT of RF power amplifier 10 is coupled by coupler 38 to mixer 40. Coupler 38 may be a low loss coupler such that a minimal amount of power is lost in coupling output signal RF OPT to an antenna. Local oscillator 42 is also coupled to mixer 40.

The frequency of local oscillator 42 is selected so that mixer 40 couples an intermodulation distortion product, such as, for example, the third intermodulation distortion product ($3^{rd}$ IMD), of RF power amplifier 10 to amplifier 44. Those skilled in the art will appreciate that local oscillator may be tunable in frequency or selected to produce a desired frequency such that one or more desired IM distortion products are selected. Moreover, those skilled in the art will appreciate that in certain embodiments amplifier 44 may not be required.

For example, amplifier 44 amplifies and couples the $3^{rd}$ IMD of RF power amplifier 10 to BPF 46. BPF 46 frequency selects the $3^{rd}$ IMD of RF power amplifier 10, coupling the $3^{rd}$ IMD to detector 48. Detector 48 produces and couples an analog signal representative of the magnitude of the $3^{rd}$ IMD to ADC 50. As will be appreciated by those skilled in the art, detector 48 may be a diode. ADC 50 converts the analog signal representative of the magnitude of the $3^{rd}$ IMD into a digital signal, and couples the digital signal to processor 52.

Processor 52 selects an optimal set of predistortion values using a gradient search, e.g., comparing successive values of the magnitude of the $3^{rd}$ IMD, to minimize the $3^{rd}$ IMD and thereby improve the linearity of the response of RF power amplifier 10.

Processor 52 may also apply a mathematical function, such as a spline function, to update predistortion values in the LUT 14. Those skilled in the art having the benefit of the present disclosure will readily appreciate the application of a spline function. Such application of a spline function involves analyzing the amplitude to amplitude (AM-AM) and amplitude to phase (AM-PM) predistortion curves, referring to the inputs and outputs of the RF power amplifier 10 respectively, and placing knots along the LUT 14 index to most closely resemble the transfer characteristics of RF power amplifier 10. Those skilled in the art will appreciate that other mathematical functions may also be used without departing from the spirit of the present invention.

For RF power amplifier 10, each knot is then varied in magnitude only. For example, during operation, the magnitude of each knot is changed, predistortion values are generated, and the $3^{rd}$ IMD is measured to determine whether the change in the magnitude of the knot improved the $3^{rd}$ IMD performance. This process is repeated continuously to improve the linearity of the response of RF power amplifier 10.

In other embodiments of the present invention knot placement along the LUT index may also be varied. In these embodiments, the complexity of the processing performed by a processor, such as processor 52, is essentially doubled. Moreover, in such embodiments, there may exist a subset of knots for which varying the placement along a LUT index may be beneficial.

Those skilled in the art will appreciate that electrical components other than coupler 38, mixer 40, local oscillator 42, amplifier 44, BPF 46, detector 48, ADC 50, and processor 52 may be used as desired to select one or more intermodulation distortion products from the output of a RF power amplifier. Thus, coupler 38, mixer 40, local oscillator 42, amplifier 44, BPF 46, detector 48, ADC 50, and processor 52 are shown for purposes of example and are, therefore, merely exemplary in nature.

Such an embodiment 20 may be thought of as an open loop configuration, being unconditionally stable, the output loop 16 being closed only for purposes of updating predistortion values in LUT 14. Moreover, such an embodiment 20 is "adaptive" in that predistortion values in the look-up table change with time. Such an embodiment 20 is also "uncorrelated" since the predistortion values that are applied are based on the $3^{rd}$ IMD of a previous in-phase and quadrature-phase signal, and not the in-phase and quadrature-phase signal the RF power amplifier is about to amplify as in a correlated adaptive predistorter.

Referring now to FIG. 2, a second embodiment 20' of an amplifier system is illustrated. Amplifier system 20' in FIG. 2 is similar to amplifier system 20 in FIG. 1, differing only in the input loop 18'. Therefore, only input loop 18' will be described. Otherwise, as will be appreciated by those skilled in the art, embodiment 20' of FIG. 2 operates in like manner to embodiment 20 of FIG. 1.

Amplifier system 20' comprises an RF power amplifier 10 and an uncorrelated adaptive predistorter 12'. Uncorrelated adaptive predistorter 12' comprises an input loop 18' and an output loop 16. Input loop 18' comprises a first converter circuit (I/Q to M/θ) 54, LUT 14', multiplier circuit 56, adder circuit 58, a second converter circuit (M'/θ' to I'/Q') 60, real and imaginary circuits 26, 28, first and second digital-to-analog converters (DACs) 30, 32, quadrature modulator 34, and RF oscillator 36.

As configured in FIG. 2 input loop 18' accepts an input signal of the type including in-phase and quadrature-phase components I+jQ, again referred to as a "baseband signal", coupling the signal I+jQ to first converter circuit (I/Q to M/θ) 54. First converter circuit (I/Q to M/θ) 54 converts signal I+jQ into magnitude M and phase θ components. Magnitude component M is coupled to multiplier circuit 56 and LUT 14'. Phase component θ is coupled to adder circuit 58. Magnitude component M functions as a scalar value representative of the power of the baseband signal I+jQ, and indexes LUT 14'.

LUT 14' contains predistortion values G, Φ for the magnitude and phase components M, θ, respectively, of baseband signal I+jQ. LUT 14' couples predistortion values G, Φ to multiplier circuit 56 and adder circuit 58, respectively, where the predistortion values G, Φ are combined with the magnitude and phase components M, θ of signal I+jQ, forming predistorted magnitude and phase components M', θ'.

Multiplier circuit 56 and adder circuit 58 couple the predistorted magnitude and phase components M', θ' to second converter circuit (M'/θ' to I'/Q') 60. Second converter circuit (M'/θ to I'/Q') 60 converts the predistorted magnitude and phase components M', θ to in-phase I' and quadrature-phase Q' components of predistorted signal I'+jQ'. The in-phase I' and quadrature-phase Q' components are coupled to real (RE( )) and imaginary circuits (IM( )) 26, 28, respectively. Those skilled in the art will appreciate that the separation of the real and imaginary portions of input signal I+jQ may be traditionally done inside second converter circuit 60, however, real (RE( )) and imaginary (IM( )) circuits 26, 28 are included for purposes of further illustration should any additional circuitry be necessary for separation in a particular embodiment.

The remaining elements, i.e., first and second DACs 30, 32, quadrature modulator 34, and RF oscillator 36, of input loop 18' illustrated in FIG. 2 operate in like manner to that of input loop 18 of FIG. 1.

As will be appreciated by those skilled in that art, both amplifier system 20 of FIG. 1 and amplifier system 20' of FIG. 2 operate on a baseband input signal including in-phase and quadrature-phase components. However, amplifier system 20 differs from amplifier system 20' in that input loop 18 of FIG. 1 operates on the input signal in rectangular form (I/Q), whereas input loop 18' of FIG. 2 operates on the input signal in polar form (M, θ). Thus, the present invention does not rely on processing an input signal in any particular form.

Referring now to FIG. 3, a third embodiment 20" of an amplifier system is illustrated. Amplifier system 20" in FIG. 3 is similar to amplifier systems 20 and 20' in FIGS. 1 and 2, differing only in the input loop 18". Therefore, only input loop 18" is described. Embodiment 20" of FIG. 3 operates in like manner to the embodiments 20, 20' of FIGS. 1 and 2 otherwise.

Amplifier system 20" comprises an RF power amplifier 10 and an uncorrelated adaptive predistorter 12". Uncorrelated adaptive predistorter 12" comprises an input loop 18" and an output loop 16. Input loop 18" comprises delay circuit 62, detector circuit 64, analog-to-digital converter (ADC) 66, complex attenuator 68, and LUT 14".

As configured in FIG. 1 input loop 18 accepts an input signal of the type including in-phase and quadrature-phase components I+jQ, referred to herein as a "baseband signal", coupling the signal I+jQ to envelope detection circuit 22 and complex multiplier 24.

Input loop 18" accepts a modulated RF signal represented in type by $A(t)\cos[\omega(t)+\theta(t)]$. Signal $A(t)\cos[\omega t+\theta(t)]$ is coupled to delay circuit 62 and detector circuit 64. Detector circuit 64 produces a scalar value $A(t)$ representative of the power of signal $A(t)\cos[\omega(t)+\theta(t)]$. Those skilled in the art will appreciate that a diode is one example of a detector circuit 64. Detector circuit 64 is coupled to ADC 66. ADC 66 converts scalar value $A(t)$ to a digital signal that functions as an index to LUT 14".

LUT 14" contains predistortion values for the magnitude and phase components of input signal $A(t)\cos[\omega(t)+\theta(t)]$. LUT 14" couples the predistortion values to complex attenuator 68 wherein the predistortion values affect the magnitude and phase components of input signal $A(t)\cos[\omega(t)+\theta(t)]$, forming predistorted signal $A'(t)\cos[\omega'(t)+\theta'(t)]$. Delay circuit 62 allows enough time for detection and conversion such that signal $A(t)\cos[\omega(t)+\theta(t)]$ is coupled to the complex attenuator 68 at the same time as the predistortion values. Complex attenuator 68 couples the predistorted signal $A'(t)\cos[\omega'(t)+\theta'(t)]$ to RF power amplifier 10.

It will be apparent to those skilled in the art that a power attenuator combined with a phase shifter may function as a complex attenuator. Further, it will also be apparent to those skilled in the art that a vector modulator may be used as a complex attenuator.

As will be appreciated by those skilled in that art, amplifier system 20" of FIG. 3 operates on a sinusoidal or RF based input signal. Thus, unlike input loop 18 of FIG. 1 and input loop 18' of FIG. 2 that operate on an input signal in rectangular form (I/Q) and polar form (M, θ), respectively, input loop 18" operates on a sinusoidal signal. Thus, the present invention is not limited in the form of input signal used.

While the present invention has been illustrated by the description of the embodiments thereof, and while the embodiments have been described in considerable detail, it is not the intention of the applicants to restrict or in any way limit the scope of the appended claims to such detail. For example, it will be understood that a signal input to an uncorrelated adaptive predistorter may take any one of several forms, including but not limited to the types I+jQ and $A(t)\cos[\omega(t)+\theta(t)]$, representing in-phase and quadrature-phase components and a modulated carrier signal, respectively. Moreover, an input loop 18, 18', 18" may be configured accordingly to accommodate such signals. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicants' general inventive concept.

What is claimed is:

1. An uncorrelated adaptive predistorter configured for use with an RF power amplifier, the uncorrelated adaptive predistorter comprising:
    an input loop configured to be coupled to the input of an RF power amplifier, the input loop including a look-up table containing predistortion values derived from a spline function with knots wherein knots of the spline function are placed along an index of the look-up table, the input loop configured to apply the predistortion values to an input signal, in response to a monotonically increasing function of the input signal power, for forming a predistorted input signal; and
    an output loop coupled to the output of the RF power amplifier, the output loop including circuitry operable for selecting an intermodulation distortion product from the RF power amplifier output and including detector circuitry configured to measure the magnitude of the intermodulation distortion product of the RF power amplifier output resulting from the predistorted input signal;
    processing circuitry operable, upon variation of the placement of the knots along the look-up table index, to generate predistortion values and to evaluate the measured magnitudes of the respective intermodulation distortion products that result from the variation in knot placement and resulting predistortion values, the processing circuitry further operable to update the predistortion values in the look-up table based on the magnitude evaluation, so that the updated predistortion values in the look-up table are uncorrelated with respect to the input signal.

2. The uncorrelated adaptive predistorter of claim 1, wherein the monotonically increasing function of the input signal power includes at least one of the input power, the logarithm of the input power, and the square root of the input power.

3. The uncorrelated adaptive predistorter of claim 1, wherein the intermodulation distortion product is the third intermodulation distortion product.

4. The uncorrelated adaptive predistorter of claim 1, wherein the input signal is of the type of at least one of a baseband signal and a modulated RF signal.

5. The uncorrelated adaptive predistorter of claim 1, wherein the input signal is a baseband signal, the predistortion values in the look-up table are in in-phase and quadrature-phase form, and the input loop comprises:
    an envelope detection circuit coupled to the look-up table and configured to produce a scalar value representative of the power of the input signal, the scalar value functioning as an index to the look-up table;
    a complex multipler coupled to the look-up table and configured to combine predistortion values in the look-up table with the input signal and output a predistortion signal;
    first and second digital-to-analog converters coupled to the complex multiplier and configured to operate on in-phase and quadrature-phase components of the predistortion signal;
    a quadrature modulator coupled to the first and the second digital-to-analog converters and configured to apply analog in-phase and quadrature-phase predistortion signals to a carrier signal; and
    an RF oscillator coupled to the quadrature modulator and configured to provide the carrier signal thereto.

6. The uncorrelated adaptive predistorter of claim 1, wherein the input signal is a baseband signal, the predistortion values in the look-up table are in the form of magnitude and phase, and the input loop comprises:
    a first converter circuit coupled to the look-up table and configured to convert the input signal into magnitude and phase form, the magnitude functioning as an index to the look-up table;
    a multiplier circuit coupled to the first converter circuit and the look-up table, the multiplier circuit configured to combine a magnitude predistortion value in the look-up table with the magnitude of the input signal;

an adder circuit coupled to the first converter circuit and the look-up table, the adder circuit configured to combine a phase predistortion value in the look-up table with the phase of input signal;

a second converter circuit coupled to the multiplier circuit and the adder circuit, and configured to output a predistortion signal;

first and second digital-to-analog converters coupled to the second converter circuit and configured to operate on in-phase and quadrature-phase components of the predistortion signal;

a quadrature modulator coupled to the first and the second digital-to-analog converters and configured to apply analog in-phase and quadrature-phase predistortion signals to a carrier signal; and an RF oscillator coupled to the quadrature modulator and configured to provide the carrier signal thereto.

7. The uncorrelated adaptive predistorter of claim 1, wherein the input signal is a modulated RF signal, the predistortion values in the look-up table are in the form of magnitude and phase, and the input loop comprises:

a detector circuit coupled to the look-up table and configured to produce a scalar value representative of the power of the input signal;

an analog-to-digital converter circuit coupled to the detector circuit and the look-up table, the analog-to-digital converter circuit configured to convert the scalar value to a digital signal that functions as an index to the look-up table;

a complex attenuator coupled to the look-up table and configured to combine predistortion values in the look-up table with the input signal; and a delay circuit coupled to the complex attenuator and configured to delay the application of the input signal to the complex attenuator.

8. The uncorrelated adaptive predistorter of claim 7, wherein the complex attenuator comprises:

a power attenuator; and a phase shifter.

9. The uncorrelated adaptive predistorter of claim 7, wherein the complex attenuator comprises a vector modulator.

10. The uncorrelated adaptive predistorter of claim 1, wherein the output loop comprises:

a coupler coupled to the output of the RF power amplifier;

a mixer coupled to the coupler;

a local oscillator coupled to the mixer and configured to output a frequency so that the mixer selects the third intermodulation distortion product of the RF power amplifier;

an amplifier coupled to the mixer and configured to amplify the third intermodulation distortion product;

a bandpass filter coupled to the amplifier and configured to frequency select the third intermodulation distortion product;

a detector coupled to the bandpass filter and configured to produce an analog signal representative of the magnitude of the third intermodulation distortion product; and an analog-to-digital converter coupled to the detector and configured to convert the analog signal representative of the magnitude of the third intermodulation distortion product to a digital signal; the processing circuitry coupled to the analog-to-digital converter and the look-up table and configured to select an optimal set of predistortion values.

11. The uncorrelated adaptive predistorter of claim 1, wherein the application of the spline function involves analyzing amplitude to amplitude and amplitude to phase predistortion curves.

12. The uncorrelated adaptive predistorter of claim 1, wherein the processing circuitry is selectively active to update the predistortion values in the look-up table.

13. The uncorrelated adaptive predistorter of claim 1, wherein the variation involves varying the magnitude of at least one knot, and the processing circuitry is further operable for generating predistortion values, and measuring an intermodulation distortion product to determine whether the change in the magnitude of the knot improved the intermodulation distortion performance.

14. An amplifier system comprising an RF power amplifier and an uncorrelated adaptive predistorter, the uncorrelated adaptive predistorter comprising:

an input loop configured to be coupled to the input of the RF power amplifier, the input loop including a look-up table containing predistortion values derived from a spline function with knots wherein knots of the spline function are placed along an index of the look-up table, the input loop configured to apply the predistortion values to an input signal, in response to a monotonically increasing function of the input signal power, for forming a predistorted input signal; and an output loop coupled to the output of the RF power amplifier, the output loop including circuitry operable for selecting an intermodulation distortion product from the RF power amplifier output and including detector circuitry configured to measure the magnitude of the intermodulation distortion product of the RF power amplifier output resulting from the predistorted input signal;

processing circuitry operable, upon variation of the placement of the knots along the look-up table index, to generate predistortion values and to evaluate the measured magnitudes of the respective intermodulation distortion products that result from the variation in knot placement and resulting predistortion values, the processing circuitry further operable to update the predistortion values in the look-up table based on the magnitude evaluation, so that the updated predistortion values in the look-up table are uncorrelated with respect to the input signal.

15. The amplifier system of claim 14, wherein the monotonically increasing function of the input signal power includes at least one of the input power, the logarithm of the input power, and the square root of the input power.

16. The amplifier system of claim 14, wherein the intermodulation distortion product is the third intermodulation distortion product.

17. The amplifier system of claim 14, wherein the input signal is of the type of at least one of a baseband signal and a modulated RF signal.

18. The amplifier system of claim 14, wherein the input signal is a baseband signal, the predistortion values in the look-up table are in in-phase and quadrature-phase form, and the input loop comprises:

an envelope detection circuit coupled to the look-up table and configured to produce a scalar value representative of the power of the input signal, the scalar value functioning as an index to the look-up table;

a complex multiplier coupled to the look-up table and configured to combine predistortion values in the look-up table with the input signal and output a predistortion signal;

first and second of digital-to-analog converters coupled to the complex multiplier and configured to operate on in-phase and quadrature-phase components of the pre-distortion signal;

a quadrature modulator coupled to the first and the second digital-to-analog converters and configured to apply the analog in-phase and quadrature-phase pre-distortion signals to a carrier signal; and an RF oscillator coupled to the quadrature modulator and configured to provide the carrier signal thereto.

19. The amplifier system of claim 14, wherein the input signal is a baseband signal, the predistortion values in the look-up table are in the form of magnitude and phase, and the input loop comprises:

a first converter circuit coupled to the look-up table and configured to convert the input signal into magnitude and phase form, the magnitude functioning as an index to the look-up table;

a multiplier circuit coupled to the first converter circuit and the look-up table, the multiplier circuit configured to combine a magnitude predistortion value in the look-up table with the magnitude of input signal;

an adder circuit coupled to the first converter circuit and the look-up table, the adder circuit configured to combine a phase predistortion value in the look-up table with the phase of input signal;

a second converter circuit coupled to the multipler circuit and the adder circuit, and configured to output a predistortion signal;

first and second digital-to-analog converters coupled to the second converter circuit and configured to operate on in-phase and quadrature-phase components of the pre-distortion signal;

a quadrature modulator coupled to the first and the second digital-to-analog converters and configured to apply analog in-phase and quadrature-phase predistortion signals to a carrier signal; and an RF oscillator coupled to the quadrature modulator and configured to provide the carrier signal thereto.

20. The amplifier system of claim 14, wherein the output loop comprises:

a coupler coupled to the output of the RF power amplifier;

a mixer coupled to the coupler;

a local oscillator coupled to the mixer and configured to output a frequency so that the mixer selects the third intermodulation distortion product of the RF power amplifier;

an amplifier coupled to the mixer and configured to amplify the third intermodulation distortion product;

a bandpass filter coupled to the amplifier and configured to frequency select the third intermodulation distortion product;

a detector coupled to the bandpass filter and configured to produce an analog signal representative of the magnitude of the third intermodulation distortion product; and an analog-to-digital converter coupled to the detector and configured to convert the analog signal representative of the magnitude of the third intermodulation distortion product to a digital signal;

the processing circuitry coupled to the analog-to-digital converter and the look-up table and configured to select an optimal set of predistortion values.

21. The amplifier system of claim 14, wherein the application of the spline function involves analyzing amplitude to amplitude and amplitude to phase predistortion curves.

22. The amplifier system of claim 14, wherein the processing circuitry is selectively active to update the predistortion values in the look-up table.

23. The amplifier system of claim 14, wherein the variation involves varying the magnitude of at least one knot, and the processing circuitry is further operable for generating predistortion values, and measuring an intermodulation distortion product to determine whether the change in the magnitude of the knot improved the intermodulation distortion performance.

24. An amplifier system comprising an RF power amplifier and an uncorrelated adaptive predistorter, the uncorrelated adaptive predistorter comprising:

an input loop configured to be coupled to the input of the RF power amplifier, the input loop including a look-up table containing magnitude and phase predistortion values derived from a spline function with variables wherein knots of the spline function are placed along an index of the look-up table, the input loop configured to apply the predistortion values to a modulated RF input signal, in response to a monotonically increasing function of the input signal power, for forming a predistorted input signal;

the input loop including a detector circuit coupled to the look-up table and configured to produce a scalar value representative of the power of the input signal;

an analog-to-digital converter circuit coupled to the detector circuit and the look-up table, the analog-to-digital converter circuit configured to convert the scalar value to a digital signal that functions as an index to the look-up table;

a complex attenuator coupled to the look-up table and configured to combine predistortion values in the look-up table with the input signal; and a delay circuit coupled to the complex attenuator and configured to delay the application of the input signal to the complex attenuator;

an output loop coupled to the output of the RF power amplifier, the output loop including circuitry operable for selecting an intermodulation distortion product from the RF power amplifier output and including detector circuitry configured to measure the magnitude of the intermodulation distortion product of the RF power amplifier output resulting from the predistorted input signal;

the output loop further including processing circuitry operable, upon variation of the placement of the knots along the look-up table index, to generate predistortion values and to evaluate the measured magnitudes of the respective intermodulation distortion products that result from the variation in knot placement and resulting predistortion values, the processing circuitry further operable to update the predistortion values in the look-up table based on the magnitude evaluation, so that the updated predistortion values in the look-up table are uncorrelated with respect to the input signal.

25. The amplifier system of claim 24, wherein the complex attenuator comprises:

a power attenuator; and a phase splitter.

26. The amplifier system of claim 24, wherein the complex attenuator comprises a vector modulator.

27. An uncorrelated adaptive method of predistorting an input signal applied to an RF power amplifier, the method comprising:

producing a scalar value representative of the power of the input signal;

applying the scalar value to index a look-up table containing predistortion values derived from a spline function with knots wherein knots of the spline function are placed along an index of the look-up table and applying the predistortion values to the input signal for forming a predistorted input signal that yields an output from the RF power amplifier;

measuring the magnitude of an intermodulation distortion product of the RF power amplifier output to select optimal predistortion values;

varying the placement of the knots along the look-up table index, and generating predistortion values and evaluating the measured magnitudes of the respective intermodulation distortion products that result from the variation in knot placement and resulting predistortion values;

updating the predistortion values in the look-up table based on the magnitude evaluation, so that the updated predistortion values in the look-up table are uncorrelated with respect to the input signal; and combining the predistortion values with the input signal to improve the linearity of the RF power amplifier.

28. The method of claim 27, wherein the intermodulation distortion product is the third intermodulation distortion product.

29. The method of claim 27, wherein the spline function is applied to the amplitude to amplitude and amplitude to phase characteristics of the RF power amplifier.

30. The method of claim 27, wherein the varying step involves varying the magnitude of at least one knot, generating predistortion values, and measuring an intermodulation distortion product to determine whether the change in the magnitude of the knot improved the intermodulation distortion performance.

* * * * *